(12) United States Patent
Perner (10) Patent No.: US 7,130,235 B2
(45) Date of Patent: Oct. 31, 2006

(54) METHOD AND APPARATUS FOR A SENSE AMPLIFIER

(75) Inventor: Frederick A. Perner, Santa Barbara, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 112 days.

(21) Appl. No.: 10/934,719

(22) Filed: Sep. 3, 2004

(65) Prior Publication Data

US 2006/0050582 A1  Mar. 9, 2006

(51) Int. Cl.
*G11C 7/02* (2006.01)

(52) U.S. Cl. .................. 365/207; 365/196; 365/158; 365/189.07; 365/210

(58) Field of Classification Search ............ 365/207, 365/196, 158, 189.07, 210
See application file for complete search history.

(56) References Cited

U.S. PATENT DOCUMENTS

| | | | |
|---|---|---|---|
| 6,185,143 B1 | 2/2001 | Perner et al. | |
| 6,188,615 B1 | 2/2001 | Perner et al. | |
| 6,501,697 B1 | 12/2002 | Perner | |
| 6,504,779 B1 | 1/2003 | Perner | |
| 6,590,804 B1 | 7/2003 | Perner et al. | |
| 6,597,598 B1 | 7/2003 | Tran et al. | |
| 6,674,679 B1 | 1/2004 | Perner et al. | |
| 6,754,123 B1 | 6/2004 | Perner et al. | |
| 6,807,118 B1 | 10/2004 | Perner et al. | |
| 6,836,422 B1 * | 12/2004 | Perner et al. | 365/189.07 |
| 6,958,933 B1 * | 10/2005 | Smith et al. | 365/171 |
| 7,009,903 B1 | 3/2006 | Perner et al. | |

* cited by examiner

*Primary Examiner*—Richard Elms
*Assistant Examiner*—Toan Le (57) ABSTRACT

A gain stage in a sense amplifier receives an input signal representing a stored value and senses if the input signal is less than or not less than a reference signal and generates an output signal indicative of a first state when the input signal is less than the reference signal and an output signal indicative of a second state when the input signal is not less than the reference signal. The gain stage further comprises an integrated latch configured to latch the output signal in either the first or second state. Additionally, a controller operates a sense amplifier having multiple operating modes. Sample mode switch logic causes the sense amplifier to sample a first voltage applied to the sense amplifier's input and hold and compare mode switch logic causes the sense amplifier to hold the first voltage for comparison with a second voltage applied to the sense amplifier's input.

34 Claims, 6 Drawing Sheets

METHOD AND APPARATUS FOR A SENSE AMPLIFIER

BACKGROUND

The present invention relates to magnetic random access memories (MRAMs). Electronic appliances such as personal computers use electronic memory for data and program storage. Information is represented as bit patterns in the memory. Each bit can have two states, often referred to as a logical 0 and a logical 1 or just simply as 0 and 1.

Electronic memory often takes the physical form of a small silicon die contained within a plastic or ceramic package for physical protection. The silicon die contains the electronic circuitry of the memory and is a small piece of a larger silicon wafer, which allows a large number of memory "chips" to be manufactured together. Desirable characteristics for computer memory chips are random access, low cost, low power, high density, high speed, and writability. Often one characteristic is obtained at the expense of another. For example, extremely high-speed memory might not be low-cost, high-density, or low-power. Two types of electronic memory are frequently used in personal computers. One is dynamic random access memory (DRAM) and the other is static random access memory (SRAM).

DRAM has the characteristics of random access, low cost, moderate power, high density, moderate speed, and writability. The high density and low cost of DRAM are achieved by using tiny capacitors to store electrical charges representing the states of the bits in the memory. Unfortunately, this technique requires complex control circuitry to continually refresh the stored charges on the capacitors. If the charges are not refreshed, they leak away and the data they represent are lost. Continual refreshing of the stored charges results in increased power dissipation even when the memory is not being used, which is problematic for portable computing devices like laptop computers.

SRAM on the other hand, uses latching circuitry to store the states of the bits in the memory. Latching circuitry eliminates the need for complex refresh circuitry and allows SRAM to have very high speed. Unfortunately, the high speed is obtained at the expense of high density due to the increased amount of chip area required by the latching circuitry to store each bit. The lower density also leads to higher cost for SRAM. The extra circuitry used to store each bit also dissipates a large amount of power.

Another shortcoming of DRAM and SRAM is that they are both volatile memory technologies and so lose their stored data when power is removed. Volatile memory is problematic for portable electronic devices like laptop computers. To overcome the problem of volatility, a laptop computer writes the state of its memory to a magnetic storage disk before turning off the power. When the power is turned back on, the operating system and the programs that were previously in use must be restored to the electronic memory. This "boot up" delay is frustrating to many users and could be essentially eliminated if the electronic memory were non-volatile.

Flash memory mitigates the volatility problem for some portable electronic devices like cell phones and digital cameras. Flash memory is a type of EEPROM (electrically erasable programmable read only memory) where a bit of information is stored as a charge on an electrically isolate gate of a field effect transistor. The electrical isolation of the gate prevents the charge from leaking away and effectively makes the memory non-volatile. However, there are characteristics of flash memory that are problematic for its use as the memory of a personal computer. The first characteristic is that the memory has a limited number write/erase cycles. Secondly, to erase bits, a large section of memory is erased in a "flash," which leads to its name.

MRAM is a non-volatile memory technology that relies on the relative magnetic orientations of two magnetic layers sandwiched on either side of a magnetoresistive layer to store data. When the magnetic orientations are parallel, the magnetoresistive layer has a low resistance and when they opposite (often termed anti-parallel), the magnetoresistive layer has a higher resistance. Circuitry on the chip can sense the resistance of a single bit cell and interpret the high or low resistance as either a binary 1 or 0. Since power is not required to maintain the magnetizations, data are retained in the bit cells when power is removed. This yields the non-volatile characteristic of MRAM technology as well reducing its power consumption.

MRAM technology also has other desirable characteristics. It has potential for high density due to the simplicity of the bit cell. Unlike DRAM, which also has a simple bit cell, MRAM does not require complex refresh circuitry. This leads to simpler memory system design and lower system cost. MRAM is also inherently high-speed due to the simplicity of the bit cell.

As previously described, the state of an MRAM memory cell is read by sensing its resistance. High-density memory chips necessitate small feature sizes. These feature sizes include the area of the memory cell and the thickness of its magnetoresistive layer as well as the width and thickness of the lines reading data from the cells. Unfortunately, extremely small feature sizes engender a higher sensitivity to manufacturing variation. This manufacturing variation causes variation in the resistance of different memory cells on the same chip. Furthermore, extremely thin lines have high resistance that leads to significant resistance variations between lines of different lengths. These characteristics are problematic to accurately sensing the resistance of an individual memory cell where the absolute resistance change of the cell between the logical 1 state and the logical 0 state is small compared to resistance variation due to the aforementioned manufacturing variation and line length variation.

Accordingly, there is a need for sensing the resistance of an MRAM memory cell with a minimal amount of circuitry that is not sensitive to manufacturing variations and line resistance variations that are commonly associated with high-density memory chips.

BRIEF DESCRIPTION OF THE DRAWINGS

The present invention is illustrated by way of example and not limitation in the figures of the accompanying drawings in which.

Like reference numbers and designations in the various drawings indicate like elements.

SUMMARY OF THE INVENTION

One aspect of the present invention is an apparatus, comprising an input node configured to receive an input signal representing a stored value and a gain stage, coupled to the input node, and configured to receive the input signal and to sense if the input signal is less than a reference signal or not less the reference signal and generate an output signal indicative of a first state when the input signal is less than the reference signal and an output signal indicative of a second state when the input signal is not less than the reference signal, the gain stage further comprising a latch integrated with the gain stage and configured to latch the output signal in either the first state or the second state.

Another aspect of the present invention a controller capable of operating a sense amplifier having multiple operating modes. This controller includes sample mode switch logic capable of causing the sense amplifier to sample a first voltage applied to the sense amplifier's input and hold and compare mode switch logic capable of causing the sense amplifier to hold the first voltage for comparison with a second voltage applied to the sense amplifier's input.

Yet another aspect of the present invention includes method of sensing a memory cell state including sampling a first voltage from the memory cell by a first transistor coupled to a sense input and a second transistor also coupled to the first transistor and along with a fourth transistor and fifth transistor operating together as a current mirror that places a first voltage corresponding to the sense input on a capacitor coupled to an output of the current mirror, holding the sampled voltage from the memory cell held on the capacitor by disconnecting the capacitor from the current mirror, receiving a second voltage from the memory cell by the first transistor coupled to the sense input and comparing the second voltage on the first transistor with the held voltage on the capacitor using a comparator configured from the first transistor and the second transistor.

Another aspect of the present invention features an apparatus capable of multi-mode operation. The operational modes are selected by setting switch logic within the apparatus. The apparatus includes switch logic to effectuate sample mode, hold and compare mode, and latch mode.

DETAILED DESCRIPTION

Implementations of the present invention concern a multi-function circuit to sense and store a first voltage, compare the first voltage with a second sensed voltage, and latch the result of the comparison. Further, the circuit can be placed in a low-power state. The circuit has advantageous application as a sense amplifier for memory technologies such as MRAM where the logical state of a cell is determined by reading the cell's voltage output a first time, writing the cell to a known state, reading the cell's voltage output a second time, and then comparing the two voltages to infer the original state. Hereinafter, the multi-function circuit will be termed simply a "sense amplifier," even though the circuit also performs the functions of a sample-and-hold circuit, comparator circuit, and latch circuit.

Implementations of the present invention also concern the use of a single sense amplifier circuit to determine the state of a memory cell in a manner that is relatively insensitive to manufacturing variations that cause the characteristics of the memory cell and its coupling to the sense amplifier to vary across a single chip.

Aspects of the present invention are advantageous in at least one or more of the following ways. By having the sense amplifier circuit perform the functions of several circuits, the transistor count and circuit area are both reduced. Reduction of circuit area leads to an overall reduction in size and cost of a memory chip. Fewer active stages due to the multi-function nature of the sense amplifier results in less power consumption and generally lead to higher performance since the input signal is not required to propagate through multiple stages. Further, combining multiple functions into a single circuit reduces the pairs of differential devices to two, which lessens the overall sensitivity to threshold voltage variation endemic to circuits with more pairs of differential devices and voltage sources.

A further advantage of the present invention is its relative insensitivity to manufacturing variation associated with high-density chips with extremely small feature sizes. This is achieved in part by measuring a relative change in voltage rather than an absolute voltage change. For example, one form of MRAM design employs magnetoresistive memory cells configured as a resistive voltage divider. One node on the voltage divider is coupled to a bit sense line leading to a sense amplifier. A state change of a single cell results in a relatively small voltage change at the output of the voltage divider that is smaller than the absolute variation of voltages from different voltage dividers. The sample-and-hold and comparator functions in the sense amplifier of the present invention allow the sense amplifier to respond to the relative voltage change and essentially disregard the absolute voltage.

Figure 1:
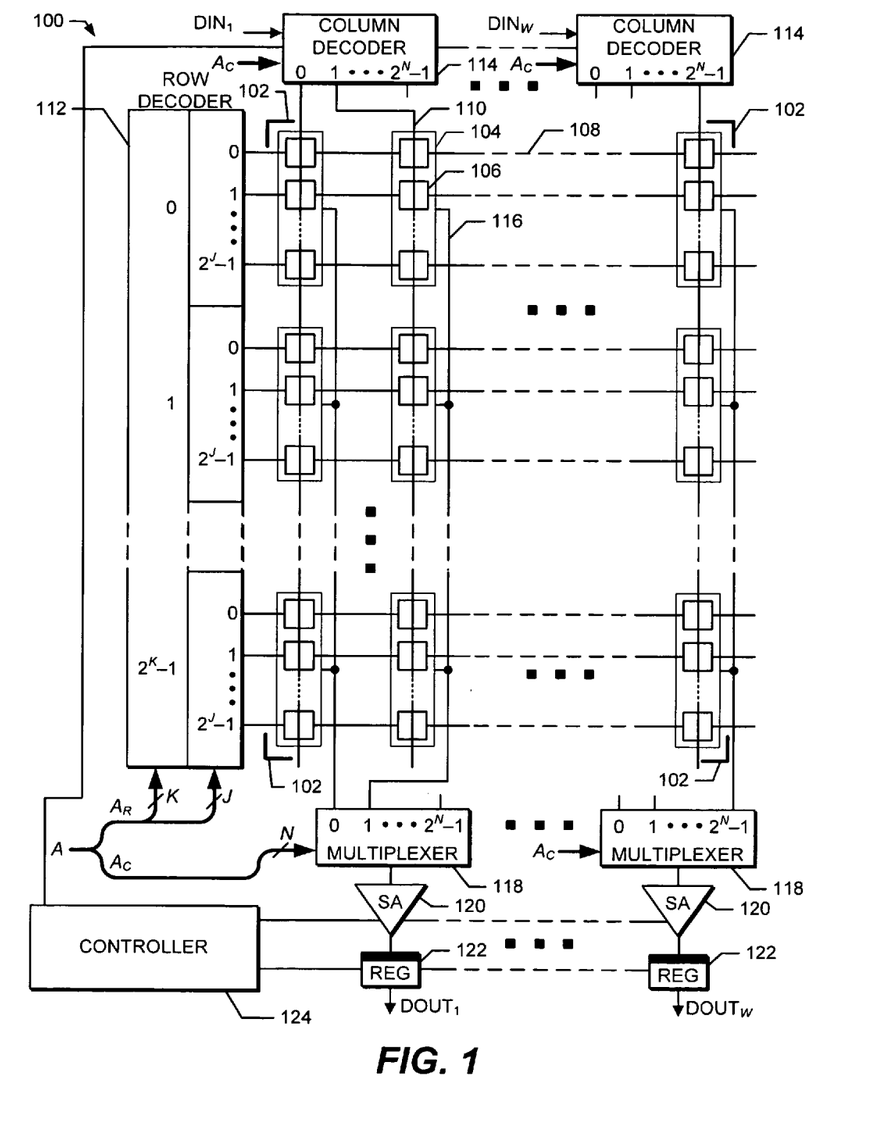
FIG. 1 is a diagram of an exemplary MRAM memory system in accordance with one implementation of the present invention.

Turning first to FIG. 1, an exemplary MRAM memory system 100 designed in accordance with one implementation of the present invention is illustrated. Memory system 100 uses binary address decoding and illustrates the data storage only, i.e., there are no extra memory cells for redundancy or error correction. Memory system 100 includes an array 102, (delineated by angle brackets) of memory cell strings 104. Each memory cell string 104 includes two or more memory cells 106. A horizontal word line 108 and a vertical bit line 110 cross each memory cell 106. A row decoder 112 drives word lines 108 and column decoders 114 drive bit lines 110. Each memory cell string 104 has a voltage divider output connected to a bit sense line 116. A single bit-sense line 116 is selected by a multiplexer 118 and connected to the input of a sense amplifier 120. The output of sense amplifier 120 is connected to the input of an output data register 122. A controller 124 is connected to and operates column decoders 114, multiplexers 118, sense amplifiers 120, and data output registers 122.

Memory system 100 has a word width of W bits, numbered 1 to W, and a memory address input A. Memory address A is divided into row and column address components $A_R$ and $A_C$ respectively. $A_C$ is N bits wide and $A_R$ is K+J bits wide. Accordingly, memory system 100 has a capacity of $2^{(N+J+K)}$ W-bit words. It follows that each memory cell string 104 has $2^J$ memory cells 106 and there are $2^K$ rows of memory cell strings 104 in array 102.

Array 102 is divided into W bit-groups. Each bit group includes $2^N$ columns of memory cell strings 104. There are W column decoders 114 (one for each bit group), each with $2^N$ vertical bit lines 110. Each column decoder 114 is controlled by its associated data input bit DIN and address component $A_C$. There are W data input lines $DIN_{1-W}$.

There are also W multiplexers 118, each selecting one of $2^N$ bit sense lines 116 from a bit group under the control of address component $A_C$. Each multiplexer 118 drives associated sense amplifier 120, which in turn drives associated single-bit output data register 122. Each output data register has an output DOUT. There are W data output lines $DOUT_{1-W}$ when taken together form the word of width W.

One implementation for writing data $DIN_{1-W}$ to address A involves decoding the $A_R$ component of A with row decoder 112 to activate a word line 108. Each of column decoders 114 decodes the $A_C$ component of address A. The DIN bit connected to each column decoder 114 controls the direction of current flow in decoded bit line 110. When an active word line 108 and an active bit line 110 cross a memory cell 106, the memory cell magnetization direction changes according to the direction of current flow in bit line 110 and a bit is written. The direction of the magnetization of memory cell 106 affects its resistance and the resistance of an individual memory cell 106 affects the voltage output from its associated memory cell string 104. The voltage output from the memory cell string represents the content of the data written.

Reading data stored at address A involves a different sequence of steps. First, row decoder 112 decodes the K-bit portion of the $A_R$ component of A to select a row of memory cell strings 104. Selecting a row causes the voltage divider output of memory cell string 104 to be placed on bit sense line 116. Multiplexer 118 selects a bit sense line 116 according to the $A_C$ component of memory address A. A first voltage on bit sense line 116 is routed through multiplexer 118 to sense amplifier 120. Controller 124 causes sense amplifier 120 to store the first voltage for later reference.

Next, controller 124 writes a known state, i.e., either a logical 1 or 0, into memory cells 106 at address A. Then, as previously described, a second voltage is read from the selected row and routed through multiplexer 118 to sense amplifier 120 where controller 124 then causes sense amplifier 120 to compare the second voltage with the stored first voltage. In one implementation of the present invention, the output of sense amplifier 120 indicates with a logical 1 that the stored first voltage is different from the second voltage resulting from writing a known state to memory cell 106. For example, if the known logical state written to memory cell 106 is a logical 0, then the output of sense amplifier 120 will contain a logical 1 if the stored first voltage is different from the second voltage or a logical 0 if the stored first voltage and second voltage are essentially the same. Put alternatively, the output of sense amplifier 120 contains the data that was in memory cell 106 before it was written with the known logical state. Controller 124 then causes the output of sense amplifier to be latched and transferred to output register 122 where it is held until the next read operation.

Figure 2A:
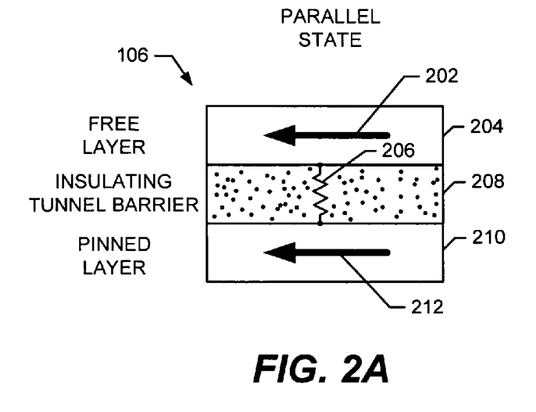
FIG. 2A is a diagram of a magnetoresistive memory cell in a parallel state in accordance with one implementation of the present invention.

FIG. 2A is a diagram of a magnetoresistive memory cell 106 in a parallel state in accordance with one implementation of the present invention. Memory cell 106 includes an insulating tunnel barrier 208 sandwiched between a pinned magnetic layer 210 and a free magnetic layer 204. Insulating tunnel barrier 208 has a resistance 206 that is a function of the relative magnetization orientations of pinned magnetic layer 210 and free magnetic layer 204. Pinned magnetic layer 210 is termed "pinned" because its magnetization 212 is oriented in a plane and fixed so as to not rotate in the presence of an applied magnetic field below a predetermined level. Free magnetic layer 204 is termed "free" because its magnetization 202 can be readily oriented in one of two directions along a preferred magnetic axis often termed the "easy" axis. Since free magnetic layer 204 and pinned magnetic layer 210 have the same magnetic orientations, cell 106 is termed to be in the "parallel" state.

Figure 2B:
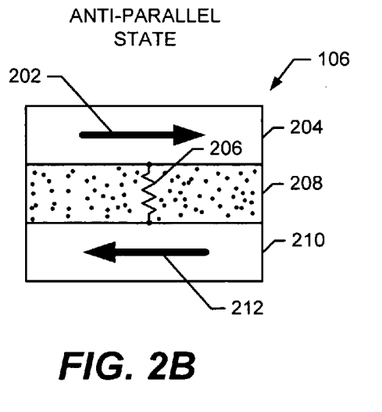
FIG. 2B is a diagram of a magnetoresistive memory cell in an anti-parallel state in accordance with one implementation of the present invention.

FIG. 2B is a diagram of a magnetoresistive memory cell 106 in an anti-parallel state in accordance with one implementation of the present invention. The state of memory cell 106 is termed "anti-parallel" because the magnetic orientation 202 of free magnetic layer 204 is different from the magnetic orientation 212 of pinned magnetic layer 210.

Insulating tunnel barrier 208 separates free magnetic layer 204 and pinned magnetic layer 210. Because insulating tunnel barrier 208 is extremely thin, quantum mechanical tunneling occurs occur between free magnetic layer 204 and pinned magnetic layer 210. This tunneling phenomenon results in an apparent resistance 206 between free magnetic layer 204 and pinned magnetic layer 210. Further, the tunneling phenomenon is electron spin dependent so resistance 206 of insulating tunnel barrier 208 is a function of the relative magnetic orientations of free magnetic layer 204 and pinned magnetic layer 210. In general, the anti-parallel state has a higher resistance 206 than the parallel state.

A single bit of information is stored in memory cell 106 by causing the relative orientation of free magnetic layer 204 to be either parallel or anti-parallel. For example, parallel could indicate the storage of a logical 1 and anti-parallel could indicate the storage of a logical 0, or vice versa. Memory cell 106 is non-volatile because its free magnetic layer 204 and pinned magnetic layer 210 retrain their relative magnetic orientation when power is removed.

Figure 2C:
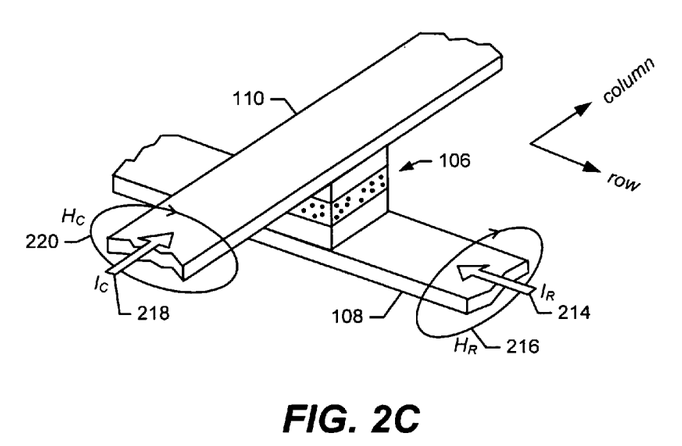
FIG. 2C is a diagram of a write operation to a magnetoresistive memory cell in accordance with one implementation of the present invention.

FIG. 2C is a diagram of a write operation to a magnetoresistive memory cell 106 in accordance with one implementation of the present invention. Memory cell 106 is crossed at substantially right angles by word line 108 and bit line 110. Orienting free magnetic layer 204 of memory cell 106 to either the parallel or anti-parallel state effects a write operation. The magnetization 202 of free magnetic layer 204 of selected memory cell 106 is oriented by applying a current $I_R$ 214 to a word line 108 and a current $I_C$ 218 to a bit line 110 that are both coincident with memory cell 106.

A magnetic field $H_R$ 216 is associated with the current $I_R$ 214 flowing in word line 108. Similarly, a magnetic field $H_C$ 220 is associated with the current $I_C$ 218 flowing in bit line 110. When current $I_R$ and current $I_C$ are of a predetermined magnitude, the combination of their respective magnetic fields $H_R$ and $H_C$ will cause magnetic orientation 202 of free magnetic layer 204 to rotate from parallel to anti-parallel or vice versa. The current magnitudes are selected so that their combined magnetic field is able to rotate magnetic orientation 202 of free magnetic layer 204 without disturbing magnetic orientation 212 of pinned magnetic layer 210. The direction of current $I_C$ in bit line 110 determines the direction of magnetic orientation 202 of free magnetic layer 204.

Figures 3A, 3B:
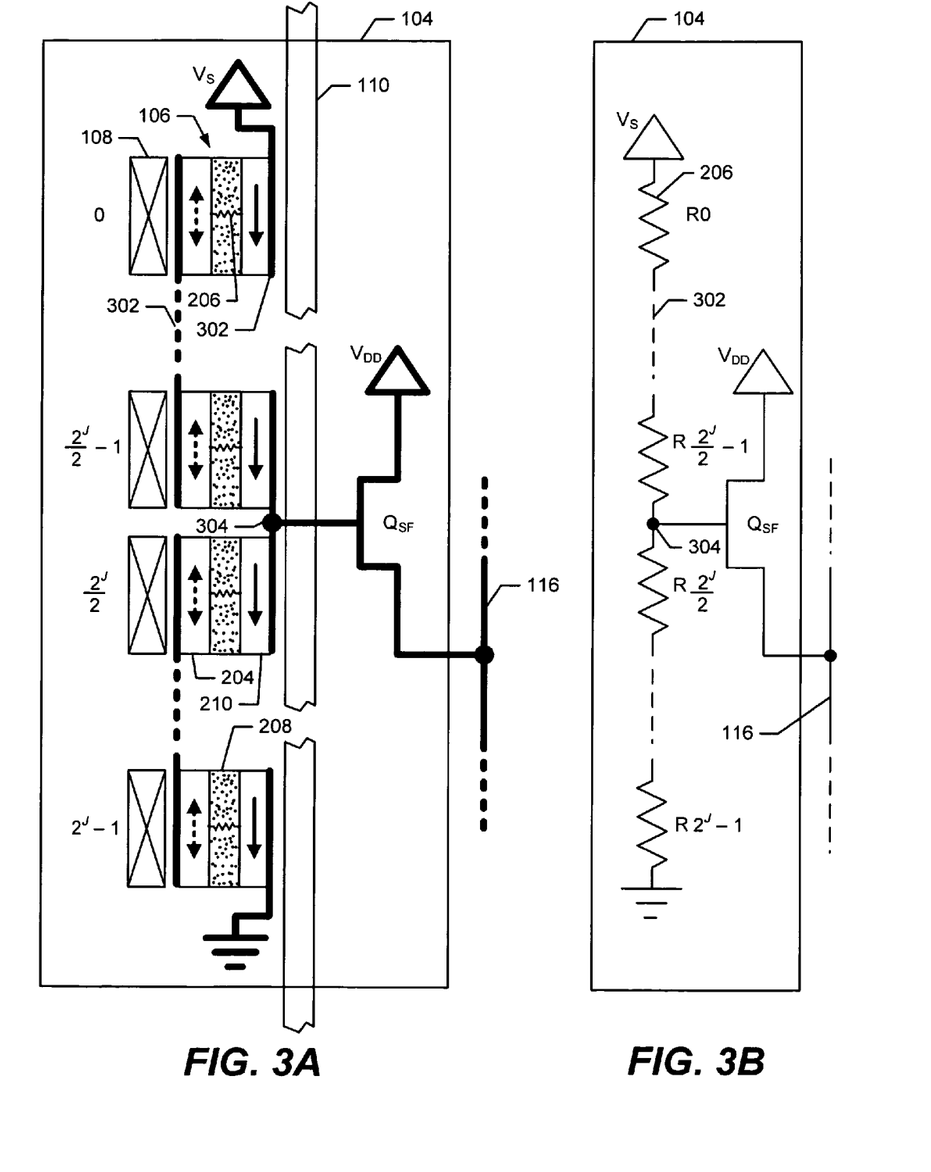
FIG. 3A is a diagram of a memory cell string in accordance with one implementation of the present invention.
FIG. 3B is a schematic diagram of a memory cell string in accordance with one implementation of the present invention.

FIG. 3A is a diagram of a memory cell string 104 in accordance with one implementation of the present invention. Memory cell string 104 includes $2^J$ memory cells 106 connected in series by metalization links 302 to form a voltage divider between switched voltage source $V_S$ and ground. Memory cells 106 are numbered 0 to $2^J-1$. The middle-two cells are numbered $2^J/2-1$ and $2^J/2$ respectively. For example, if J is equal to 3 then there are $2^3$ or 8 memory cells 106 per memory cell string 104 with the cells numbered from 0 to 7 and the middle-two cells numbered 3 and 4 respectively. Each memory cell 106 is crossed at right angels by a vertical bit line 110 and a horizontal word line 108. Junction 304, located at the midpoint of the series of memory cells 106, is connected to the gate of transistor $Q_{SF}$, configured as a source follower. The drain of transistor $Q_{SF}$ is connected to voltage source $V_{DD}$. The source of transistor $Q_{SF}$ is connected to bit sense line 116.

As previously described, memory cell 106 includes insulating tunneling barrier 208 sandwiched between pinned magnetic layer 210 and free magnetic layer 204. The resistance 206 of insulating tunneling barrier 208 is a function of the orientation of the magnetization of free magnetic layer 204. Electrically, memory cell 106 can be modeled as a resistor with resistance 206 in which pinned magnetic layer 210 and free magnetic layer 204 each forms a terminal of the resistor. The voltage divider is formed by connecting pinned magnetic layer 210 of a first memory cell, numbered 0, to switched voltage source $V_S$ and connecting free magnetic layer 204 of the first cell to free magnetic layer 204 of a second, adjacent cell. Pinned magnetic layer 210 of the second cell is connected to pinned magnetic layer 210 of a third cell, adjacent to the second cell. The connection pattern is repeated until a final cell is reached, whereupon pinned magnetic layer 210 of the final cell is connected to ground.

FIG. 3B is a schematic diagram illustrating memory cell string 104 in accordance with one implementation of the present invention. As previously described, memory cell string 104 is effectively a string of resistors, labeled R0 to R$2^J-1$, that form a voltage divider between switched voltage source $V_S$ and ground. Each resistor has a resistance 206 that is a function of the magnetic orientation of the free magnetic layer of its associated memory cell. The voltage divider output is taken from its midpoint 304 operatively connected to the gate of transistor $Q_{SF}$, configured as a source follower. The drain of transistor $Q_{SF}$ is connected to $V_{DD}$ and the source is connected to bit sense line 116. A source follower configured transistor provides extra drive capability necessary for driving bit sense line 116 and also provides isolation of the resistor string from resistor strings of other memory cell strings 104 also connected to bit sense line 116.

When any of memory cells 106 associated with memory cell string 104 are read, switched voltage source Vs is turned on, otherwise, it is at ground potential and switched voltage source Vs is off. As previously described, the magnetic orientation of the free magnetic layer associated with each memory cell is a function of the bit stored in the cell. For example, a binary 1 causes the orientation to point in one direction along the free magnetic layer's easy axis and a binary 0 causes the orientation to point in the opposite direction. There is a different resistance 206 for each orientation. Changing a cell's state changes its resistance, which is reflected as a voltage change at voltage divider midpoint 304 and conveyed by source-follower transistor $Q_{SF}$ to bit sense line 116.

Figure 4:
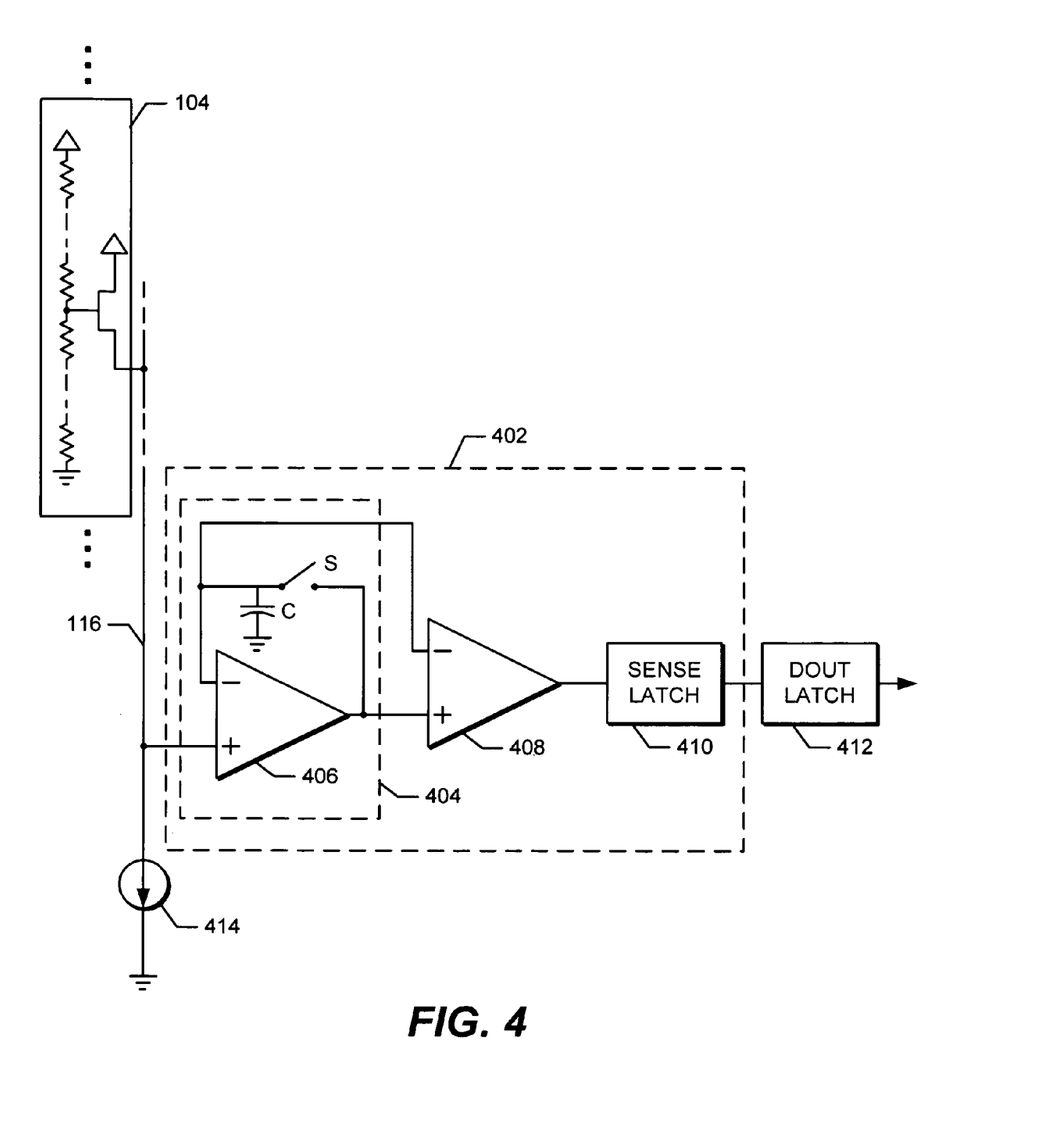
FIG. 4 is a diagram of a three-stage sense amplifier in accordance with one implementation of the present invention.

FIG. 4 is a block diagram of a three-stage sense amplifier 402 in accordance with one implementation of the present invention. Three-stage sense amplifier 402 includes a sample-and-hold circuit 404 connected to a comparator 408, which is in turn connected to a sense latch 410. Sample-and-hold circuit 404 further includes amplifier 406 whose output is connected through switch S to one terminal of capacitor C and further connected to the inverting input of amplifier 406. The other terminal of capacitor C is connected to ground. The non-inverting input of amplifier 406 is connected to a bit sense line 116 that is also connected to a current source 414 and to the outputs of one or more memory cell strings 104. The output of sense latch 410 is connected to the input of data-out latch 412.

The first function of three-stage sense amplifier 402 is to sample and hold a first voltage from memory cell string 104 that is conveyed to sample-and-hold circuit 406 via bit sense line 116. Current source 414 serves as an active load for the output of memory cell string 104. The first voltage on bit sense line 116 appears at the output of amplifier 406. The "sample" function is performed when switch S is closed, placing the first voltage on capacitor C. The "hold" function is performed when switch S is opened, leaving the first voltage or held voltage on capacitor C.

The second function of three-stage sense amplifier 402 is to sample a second voltage from memory cell string 104 and compare the second voltage with the first voltage being held on capacitor C. As before with the first voltage, the second voltage is placed on the bit sense line, which is connected to the non-inverting input of amplifier 406. The output of amplifier 406 is connected to the non-inverting input of comparator 408. The inverting input of comparator 408 is connected to capacitor C, which is holding the first sampled voltage. If the second sampled voltage is greater than the voltage on capacitor C, the output of comparator 408 will be asserted. If the second sampled voltage is less than or equal to the first or held voltage on capacitor C, the output of the comparator C will not be asserted.

The third function of three-stage sense amplifier 402 is to store the logical output state of comparator 408 in sense latch 410. Sense latch 410 allows three-stage sense amplifier 402 to begin another operation before the result of the previous operation have been used. Sense latch 410 also allows amplifier 406 and comparator 408 to be placed in a low-power state before the result of the prior operation is used. Additionally, sense latch 410 converts the signal levels of comparator 408 to the signal levels used by the logic circuitry implementing data-out latch 412, which holds the data from a read operation.

Figure 5A:
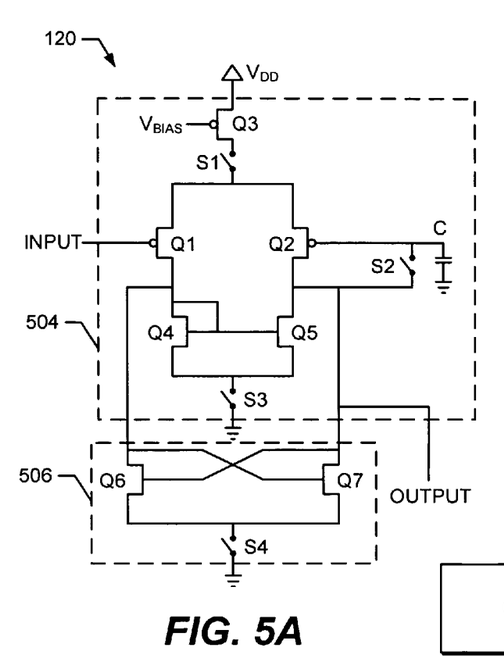
FIG. 5A is a schematic diagram of a sense amplifier in accordance with one implementation of the present invention.

FIG. 5A is a schematic diagram of a sense amplifier 120 designed in accordance with one implementation of the present invention. This single stage sense amplifier 120 is preferred over multiple stage sense amplifiers like three-stage sense amplifier 402. For example, fewer active devices allows for more compact physical layouts and denser memory circuits as well as overall lower power requirements. Further, better performance is realized using fewer stages in part because the single stage is associated with less delay than multiple stages. Sense amplifier 120 is also less sensitive to threshold voltage variations as it uses fewer pairs of differential devices. In accordance with the present invention. One pair of differential devices operate within a self referencing comparator and overcome variation by doing a relative measurement of voltages. Another differential pair used in the latch as described further in detail later herein are designed to overcome anticipated threshold voltage variations inherent in the manufacturing and fabrication processes.

Sense amplifier 120 includes a gain stage 504 and an integrated latch 506 to latch the sensed data. The input node receives an input signal representing a stored value from an electronic circuit and provides it to gain stage 504. For example, the input signal could be used to detect values stored on an MRAM storage device or any other storage device.

Gain stage 504 generally operates as a self-referencing comparator device. The set of switches S1 through S4 selectively configure the gain stage to sample the input signal, to hold the input signal, to compare the input signal with a reference signal and operate in low power mode. Setting the switches into one or four different configurations determines which of the corresponding modes the gain stage operates under (i.e., sample mode, hold mode, latch mode and low power mode). In one implementation, the set of switches associated with gain stage 504 are implemented using transistors.

In operation, gain stage 504, receives the input signal over the input node and senses if the input signal is less than a reference signal or not less the reference signal. Gain stage 504 generates an output signal indicative of a first state when the input signal is less than the reference signal and an output signal indicative of a second state when the input signal is not less than the reference signal. Latch 506 latches the output signal in either the first state or the second state captured from the output signal.

In one implementation, latch 506 is implemented using a pair of cross coupled transistors. In the illustrated example, the latch is integrated to the gain stage by coupling the inputs of the cross coupled transistors to the output signal from gain stage 504. The cross coupled transistors of latch 506 perform the latching operation by regeneratively holding the output in either the first state or the second state at an output node.

Sense amplifier 120 includes seven transistors, labeled Q1 through Q7. Sense amplifier 120 performs the functions of sampling a voltage, holding the voltage, comparing the held voltage with a second voltage, latching the comparison result, and maintaining standby in a low-power state. The settings of four switches, labeled S1 through S4, control the functionality of sense amplifier 120. A capacitor C is used to store the voltage during the sample and hold functions.

In the example sense amplifier 120 illustrated in FIG. 5I, gain stage 504 and latch 506 are implemented in accordance with the present invention as follows. Transistor Q1 has a drain, gate, and source; the drain is coupled to switch S1 and the gate coupled to a sense input. Transistor Q2 has a drain, gate, and source; the drain is coupled to switch S1 and the gate is coupled to switch S2. Capacitor C is coupled to the gate of transistor Q2 and ground. Transistor Q3 has a drain, gate, and source; the drain is coupled to a voltage source $V_{DD}$, the gate is coupled to a bias voltage source $V_{BIAS}$, and the source is coupled to switch S1. Transistor Q4 has a drain, gate, and source; the drain is coupled to the source of transistor Q1 and the gate is coupled to the drain. Transistor Q5 has a drain, gate, and source; the drain is coupled to the source of transistor Q2 and further coupled to switch S2, the gate is coupled to the gate of transistor Q4, and the source is coupled to both the source of transistor Q4 and switch S3 coupled to ground. Transistor Q6 has a drain, gate, and source; the drain is coupled to the source of transistor Q1. Transistor Q7 has a drain, gate, and source; the drain coupled to the source of transistor Q2 and further coupled to both the gate of transistor Q6 and a sense amplifier output, the gate of Q7 is coupled to the drain of transistor Q6, and the source of Q7 is coupled to both the source of transistor Q6 and switch S4 coupled to ground.

It should also be appreciated that different types of transistors can be used to implement the present invention and may depend on one or more design choices. For example, in the illustrated implementation in FIG. 5A transistors Q1, Q2, and Q3 are P-channel FETs while transistors Q4, Q5, and Q6 are N-channel FETs when the $V_{DD}$ DC voltage source is greater than the $V_{BIAS}$ DC voltage source. In one implementation, the $V_{BIAS}$ DC voltage source is grounded. In an alternate implementation of the circuit in FIG. 5A, transistors Q1, Q2, and Q3 are N-channel FETs while transistors Q4, Q5, and Q6 are P-channel FETs when the $V_{DD}$ DC voltage source is less than the $V_{BIAS}$ DC voltage source. In this latter example, the $V_{BIAS}$ DC voltage source is set to $V_{DD}$.

In another implementation of the present invention, the sense amplifier output is coupled to the source of transistor Q6, rather than the source of transistor Q7. In yet another implementation of the present invention, a second sense amplifier output is coupled to the source of transistor Q7 in addition to a first sense amplifier output coupled to the source of transistor Q6.

Figure 5B:
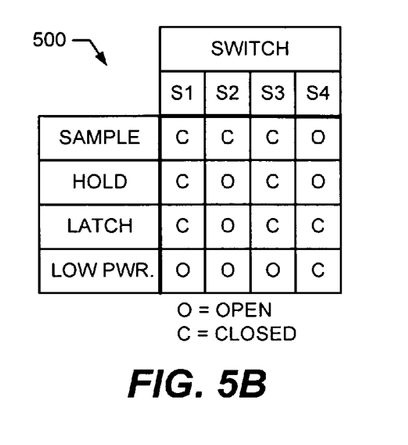
FIG. 5B is a table of sense amplifier functionalities and corresponding sense amplifier switch settings in accordance with one implementation of the present invention.

FIG. 5B is a table 500 of sense amplifier functionality corresponding to sense amplifier switch settings in accordance with one implementation of the present invention. The following operational descriptions will also make reference to the sense amplifier schematic diagram of FIG. 5A. The four functions shown in the table of FIG. 5B are sample, hold, latch, and low power standby as indicated.

In operation, closing switches S1, S2, and S3 and opening switch S4, effectuate sample mode. In sample mode, a voltage present at the sense amplifier input is replicated at capacitor C through the action of a current mirror formed by transistors Q4 and Q5. Transistor Q3 is configured as a current source with its drain connected to $V_{DD}$ and its gate connected to $V_{BIAS}$. The current mirror causes the current supplied by the current source to be equally divided between transistors Q1 and Q2. The equal currents flowing through Q1 and Q2 cause the voltage at the gate of Q2 to be equal to the voltage at the gate of Q1, which is the sense amplifier input. The gate of Q2 is coupled to capacitor C, which results in a voltage equal to the input voltage being held on capacitor C.

When sense amplifier 120 is in sample mode, opening switch S2 effectuates hold mode for the sense amplifier. Opening switch S2 removes the connection between the gate and source of transistor Q2. The gate of transistor Q2, coupled to capacitor C, now constitutes a high-impedance input to a differential amplifier. The other input to the differential amplifier is the sense amplifier input connected to the gate of transistor Q1. The held voltage on capacitor C is now compared to a second voltage at the sense amplifier input. If the second voltage is greater than the held voltage, the sense amplifier output at the drain of transistor Q5 will be a lesser voltage. If the second voltage is less than the held voltage, the sense amplifier output at the drain of transistor Q5 will be a greater voltage.

Further, closing switch S4 when sense amplifier 120 is in hold mode effectuates latch mode for the sense amplifier. Latch mode accentuates and latches the output of the differential amplifier by coupling the differential amplifier to a cross-coupled latch formed with transistors Q6 and Q7. The latch functionality results from the drain of transistor Q7 coupled to the gate of transistor Q6 and the drain of transistor Q6 coupled to the drain of transistor Q7. Turning one transistor of the pair on tends to turn the other transistor of the pair off and vice versa. The differential amplifier outputs are coupled to the latch pair by coupling the source of transistor Q1 to the gate of transistor Q7 and coupling the source of transistor Q2 to the gate of transistor Q6. Any small difference in the differential amplifier output levels is accentuated by the cross-coupled connections of transistors Q6 and Q7 and a small time interval after the closing of switch S4, the sense amplifier output assumes one of two binary output states. After the latched output is transferred to the data output register, S2 and S3 are opened to reduce power dissipation.

Figure 5C:
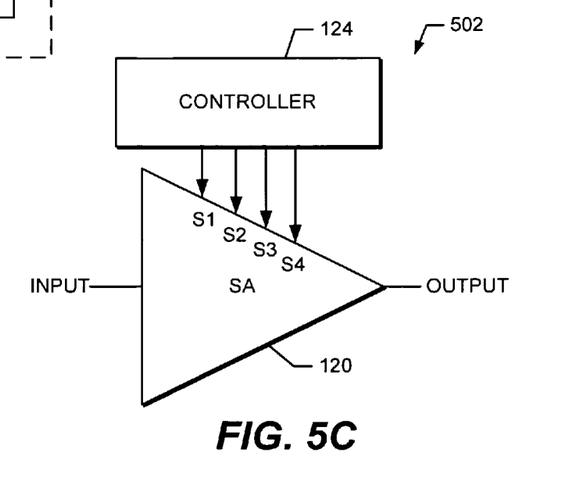
FIG. 5C is a diagram of a controller coupled to a sense amplifier with multiple operating states in accordance with one implementation of the present invention.

FIG. 5C is a block diagram 502 of controller 124 operatively coupled to sense amplifier 120 and capable of driving sense amplifier 120 into multiple operating states in accordance with one implementation of the present invention. As previously described, sense amplifier 120 includes sample mode switch logic capable of causing the sense amplifier to sample a first voltage applied to the sense amplifier's input. Additionally, sense amplifier 120 includes hold and compare mode switch logic capable of causing sense amplifier 120 to hold the first voltage for comparison with a second voltage applied to the sense amplifier's input.

Controller 124 is further capable of operating latch mode switch logic causing sense amplifier 120 to latch the sense amplifier's output into a first state if the second voltage is less than the held voltage and latch the sense amplifier's output into a second state if the second voltage is not less than the held voltage. Controller 124 is also further capable of operating logic to switch sense amplifier 120 into a low-power mode.

Controller 124 can vary the switching times applied to switches of sense amplifier 120 between zero and a predetermined interval. Different times may be allocated by controller 124 to switch sense amplifier 120 to a mode selected from the set of modes comprising sample mode, hold and compare mode, and latch mode.

Controller 124 utilizes a set of one or more switches in sense amplifier 120 to effectuate the function associated with the selected mode. Further, at least one switch in the shared set of one or more switches facilitates at least two different modes in sense amplifier 120 by switching between different switch states. For example, switch S1 as indicated in FIG. 5B is partly responsible for sense amplifier 120 entering into either sample mode when it is closed and low power mode when switch S1 is open.

Figure 6:
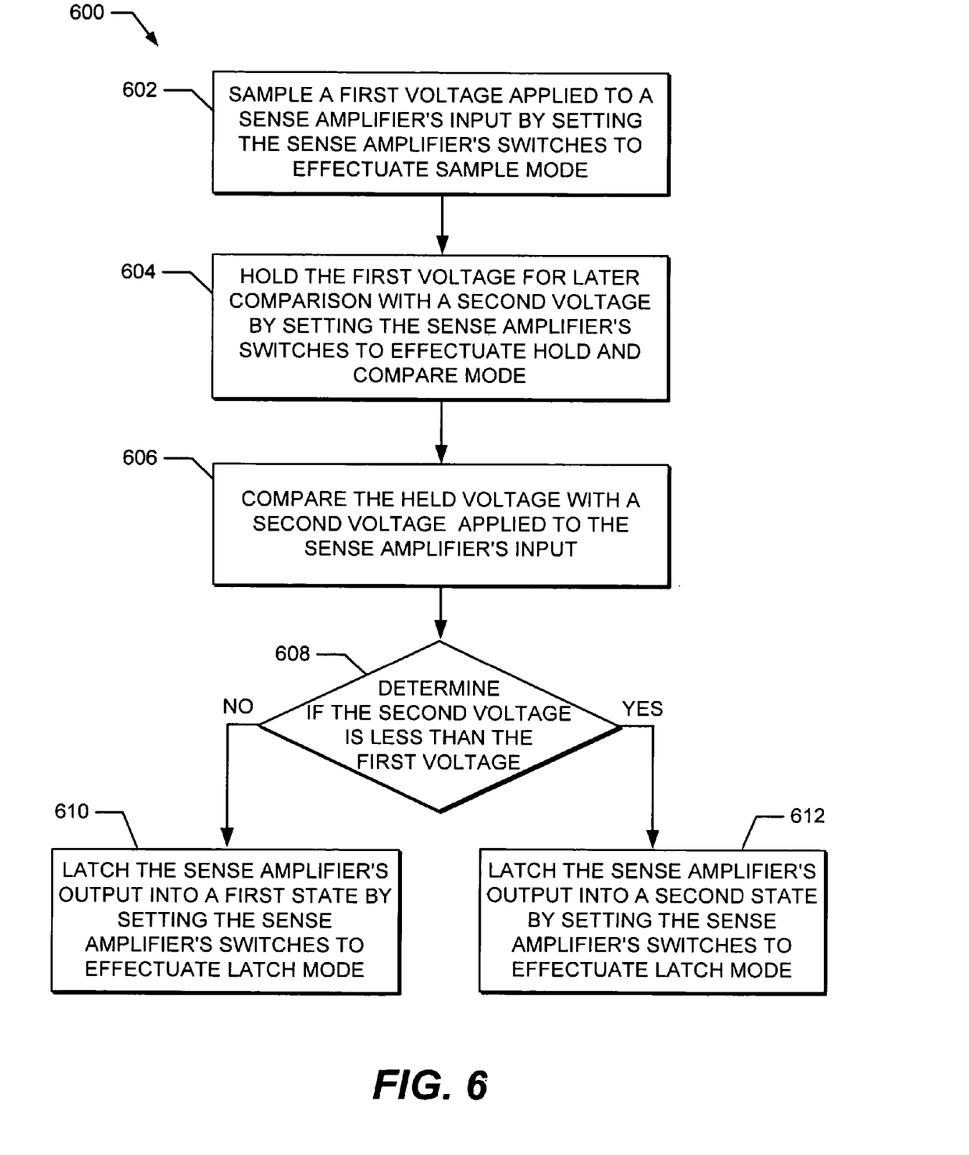
FIG. 6 is a flowchart diagram of the operations pertaining to a sense amplifier sensing a memory cell state in accordance with one implementation of the present invention.

FIG. 6 is a flowchart diagram 600 of the operations pertaining to a sense amplifier sensing a memory cell state in accordance with one implementation of the present invention. As previously described, manufacturing variations result in differences in the resistance among memory cells on an MRAM chip. Rather than sense the absolute resistance when reading a memory cell, a relative change is sensed before and after writing a known state to the memory cell. The state of the memory cell before writing the known state is inferred by the amount of relative change.

Before writing a known state to the memory cell, a first voltage from its associated voltage divider is coupled to the sense amplifier's input and sampled by setting the sense amplifier's switches to effectuate sample mode (602). As previously described, memory cells are grouped together in memory cell strings to form resistive voltage dividers. A tap on the voltage divider is coupled to a sense amplifier. Hence, a change in state of a memory cell in the resistive voltage divider results in a voltage change at the input of its associated sense amplifier and provides the sample. In one implementation as illustrated in FIG. 5C, transistor Q1 is coupled to a sense input and transistor Q2 is coupled to the transistor Q1 along with a transistor Q4 and transistor Q5 operating together as a current mirror. Together, these transistors place a first voltage corresponding to the sense input on the capacitor C coupled to an output of the current mirror.

After sampling the first voltage, the sense amplifier is configured to hold the first voltage for later comparison with a second voltage by setting the sense amplifier's switches to effectuate hold and compare mode (604). In one implementation, the sampled voltage from the memory cell is held on capacitor C by disconnecting the capacitor from the current mirror. While the sense amplifier is holding the first voltage (i.e., the held voltage), a known state is written to the memory cell being sensed.

After writing the memory cell, a second voltage from the memory cell is applied to the sense amplifiers input. As illustrated in FIG. 5A, transistor Q1 receives the second voltage from the memory cell through the sense input. While still in hold and compare mode, the sense amplifier compares the held voltage with a second voltage applied to its input (606). In the illustrated example, the second voltage on transistor Q1 is compared with the held voltage on the capacitor using a comparator configured from transistor Q1 and transistor Q2. The sense amplifier then determines if the second voltage is less than the held first voltage (608).

If the second voltage is not less than the held first voltage, the sense amplifier's output is latched into a first state by setting the sense amplifier's switches to effectuate latch mode (610). If the second voltage is less than the held first voltage, the sense amplifier's output is latched into a second state by setting the sense amplifier's switches to effectuate latch mode (612). As previously described, the latch circuit is formed in one implementation from transistor Q6 cross coupled to transistor Q7. It should also be appreciated that the transistors perform the different modes of sampling, holding, receiving and comparing by setting one or more switches coupled to transistors Q1–Q7 as illustrated and previously described in accordance with one implementation of the present invention.

While specific embodiments have been described herein for the purposes of illustration, various modifications may be made without departing from the spirit and scope of the invention. Accordingly, the invention is not limited to the above-described implementations, but instead is defined by the appended claims in light of their full scope of equivalents.

What is claimed is:

1. An apparatus, comprising:
   an input node configured to receive an input signal representing a stored value; and
   a gain stage, coupled to the input node, and configured to receive the input signal and to sense if the input signal is less than a reference signal or not less the reference signal and generate an output signal indicative of a first state when the input signal is less than the reference signal and an output signal indicative of a second state when the input signal is not less than the reference signal, the gain stage further comprising a latch integrated with the gain stage and configured to latch the output signal in either the first state or the second state.

2. The apparatus of claim 1 wherein the latch is a pair of cross coupled transistors.

3. The apparatus of claim 2 wherein the cross coupled transistors regeneratively hold the output in either the first state or the second state at an output node.

4. The apparatus of claim 2 wherein the latch is integrated to the gain stage by coupling the inputs of the cross coupled transistors to the output signal from the gain stage.

5. The apparatus of claim 1 wherein the gain stage operates as a self-referencing comparator device.

6. The apparatus of claim 1 wherein the gain stage further comprises a set of switches to selectively configure the gain stage to sample the input signal, to hold the input signal, and to compare the input signal with a reference signal.

7. The apparatus of claim 6 wherein the switches are implemented using transistors.

8. The apparatus of claim 6 wherein the gain stage is configured as a sample circuit by setting the one or more of the switches in a first configuration.

9. The apparatus of claim 6 wherein the gain stage is configured as a hold circuit by setting the one or more of the switches in a second configuration.

10. The apparatus of claim 6 wherein the gain stage is configured as a compare circuit by setting the one or more of the switches in a third configuration.

11. The apparatus of claim 10 wherein the memory device is a MRAM.

12. The apparatus of claim 1 wherein the apparatus is a sense amplifier in a memory device.

13. A controller capable of operating sense amplifier having multiple operating modes, comprising:
sample mode switch logic capable of causing the sense amplifier to sample a first voltage applied to the sense amplifier's input; and
hold and compare mode switch logic capable of causing the sense amplifier to hold the first voltage for comparison with a second voltage applied to the sense amplifier's input.

14. The controller of claim 13 further comprising:
latch mode switch logic capable of causing the sense amplifier to latch the sense amplifier's output into a first state if the held first voltage is less than the second voltage and capable of causing the sense amplifier to latch the sense amplifier's output into a second state if the held first voltage is not less than the second voltage.

15. The controller of claim 13 further comprising logic to switch the sense amplifier into a low-power mode.

16. The controller of claim 13 wherein the time allocated to switching between the modes of the sense amplifier can be selectively varied between zero and a predetermined interval.

17. The controller of claim 13 wherein the mode is selected from of a set of modes comprising a sample mode, a hold and compare mode, and a latch mode and utilizes a set of one or more switches in the sense amplifier to effectuate the function associated with the selected mode.

18. The controller of claim 17 wherein at least one switch in the set of one or more switches facilitates at least two different modes in the sense amplifier by switching between different switch states.

19. A method of sensing a memory cell state, comprising:
sampling a first voltage from the memory cell by a first transistor coupled to a sense input and a second transistor also coupled to the first transistor and along with a fourth transistor and fifth transistor operating together as a current mirror that places a first voltage corresponding to the sense input on a capacitor coupled to an output of the current mirror;
holding the sampled voltage from the memory cell held on the capacitor by disconnecting the capacitor from the current mirror;
receiving a second voltage from the memory cell by the first transistor coupled to the sense input; and
comparing the second voltage on the first transistor with the held voltage on the capacitor using a comparator configured from the first transistor and the second transistor.

20. The method of claim 19 further comprising a third transistor configured as a current source that provides current to operate the first, second, fourth and fifth transistors.

21. The method of claim 19 further comprising,
latching on a latch circuit formed from a sixth transistor cross coupled to a seventh transistor, a first output state if the second voltage is less than the held voltage; and
latching on the latch circuit formed from the sixth transistor cross coupled to the seventh transistor, a second output state if the second voltage is not less than the held voltage.

22. The method of claim 19 further comprising,
setting one or more switches coupled to transistors to configure the transistors to perform the sampling, holding, receiving and comparing.

23. A sense amplifier having a sense input and an output, comprising:
a first transistor having a drain, gate, and source, the source coupled to a first switch, the gate coupled to the sense input;
a second transistor having a drain, gate, and source, the source coupled to the first switch, the gate coupled to a second switch;
a capacitor coupled to the gate of the second transistor and ground;
a third transistor operating as a current source, having a drain, gate, and source, the source coupled a first DC voltage source, the gate coupled to a bias voltage source, the drain coupled to the first switch;
a fourth transistor having a drain, gate, and source, the drain coupled to drain of the first transistor, the gate coupled to the drain;
a fifth transistor having a drain, gate, and source, the drain coupled to drain of the second transistor and further coupled to the second switch, the gate coupled to the gate of the fourth transistor, the source coupled to both the source of the fourth transistor and a third switch coupled to a second DC voltage source;
a sixth transistor having a drain, gate, and source, the drain coupled to source of the first transistor; and
a seventh transistor having a drain, gate, and source, the drain coupled to source of the second transistor and further coupled to both the gate of the sixth transistor and the sense amplifier output, the gate coupled to the drain of the sixth transistor, the source coupled to both the source of the sixth transistor and a fourth switch coupled to a second DC voltage source.

24. The sense amplifier of claim 23 wherein the first, second and third transistors are P-channel FETs and the fourth, fifth, sixth and seventh transistors are N-channel FETs when the first DC voltage source is greater than the second DC voltage source.

25. The sense amplifier of claim 23 wherein the second DC voltage source is ground.

26. The sense amplifier of claim 23 wherein the first, second and third transistors are N-channel FETs and the fourth, fifth, sixth and seventh transistors are P-channel FETs when the first DC voltage source is less than the second DC voltage source.

27. The sense amplifier of claim 26 wherein the second DC voltage source is VDD.

28. The sense amplifier of claim 23 wherein the sense amplifier output is coupled to the drain of the sixth transistor.

29. The sense amplifier of claim 23 further comprising a second sense amplifier output coupled to the drain of the sixth transistor.

30. The sense amplifier of claim 23 wherein a first voltage at the input is sampled by the closing of the first, second, and third switches and the opening of the fourth switch.

31. The sense amplifier of claim 30 wherein the sampled voltage is held by the opening of the second switch.

32. The sense amplifier of claim 31 wherein a second voltage at the input is compared to the held voltage, further causing the sense amplifier output to be a greater voltage if the second voltage is greater than the held voltage and causing the sense amplifier output to be a lesser voltage if the second input voltage is less than the held voltage.

33. The sense amplifier of claim 31 wherein the output is latched by the closing of the fourth switch.

34. The sense amplifier of claim 32 wherein the power dissipation is reduced by the opening of the first and third switches.

* * * * *